US009154890B2

(12) United States Patent
Fort et al.

(10) Patent No.: US 9,154,890 B2
(45) Date of Patent: Oct. 6, 2015

(54) WIRELESS DATA TRANSMISSION WITH PREDICTIVE TRANSMISSION ADJUSTMENT

(75) Inventors: Andrew Fort, Mechelen (BE); Susan Di Genova, Marsfield (AU); Yashodhan V. Moghe, Hurtsville (AU)

(73) Assignee: Cochlear Limited, Macquarie University, NSW (AU)

( * ) Notice: Subject to any disclaimer, the term of this patent is extended or adjusted under 35 U.S.C. 154(b) by 1162 days.

(21) Appl. No.: 13/045,329

(22) Filed: Mar. 10, 2011

(65) Prior Publication Data

US 2012/0213394 A1 Aug. 23, 2012

Related U.S. Application Data

(60) Provisional application No. 61/445,877, filed on Feb. 23, 2011.

(51) Int. Cl.

| | |
|---|---|
| ***H04B 7/00*** | (2006.01) |
| ***H03C 3/00*** | (2006.01) |
| ***H04R 25/00*** | (2006.01) |

(52) U.S. Cl.

CPC ............ *H04R 25/554* (2013.01); *H04R 25/606* (2013.01); *H04R 2225/43* (2013.01)

(58) Field of Classification Search

CPC . H04R 2225/43; H04R 25/554; H04R 25/606
USPC .................. 455/41.2, 84, 102, 108; 375/295; 381/315, 312, 323
See application file for complete search history.

(56) References Cited

U.S. PATENT DOCUMENTS

| | | | | |
|---|---|---|---|---|
| 6,499,111 | B2 * | 12/2002 | Mullarkey | 713/401 |
| 2009/0110121 | A1 * | 4/2009 | Bonicatto et al. | 375/340 |
| 2012/0294386 | A1 * | 11/2012 | Ghovanloo et al. | 375/295 |

* cited by examiner

*Primary Examiner* — Ping Hsieh
*Assistant Examiner* — Xin Jia

(57) ABSTRACT

The present disclosure provides a method wherein preceding and succeeding data elements of a data element to be sent next are analyzed in order to set a signal pattern which can be correctly recovered on the receiving side in spite of intersymbol interference. More particularly, depending on the transmission characteristics of the transmission path, the content of a window within the data stream to be sent wirelessly is examined in order to determine an energy content with which a data symbol has to be sent so that the data can be recovered securely.

19 Claims, 4 Drawing Sheets

WIRELESS DATA TRANSMISSION WITH PREDICTIVE TRANSMISSION ADJUSTMENT

CROSS-REFERENCE TO RELATED APPLICATIONS

The present application claims the benefit of U.S. Provisional Application No. 61/445,877, filed on Feb. 23, 2011. The content of this application is hereby incorporated by reference herein.

BACKGROUND

1. Field of Invention

The present disclosure relates to wireless data transmission with predictive transmission adjustments in an implantable hearing prosthesis such as cochlear implants, direct acoustic stimulation devices and middle ear devices.

2. Related Art

Typical implantable hearing prosthesis are semi-implantable and consist of an implantable part including a receiving coil and an external part. The external part may be a Behind-The-Ear (BTE) hearing aid device that houses a microphone, a speech processor, a transmitter and a battery. The BTE is connected to a transmitter coil and sends power and data to the implant via a transmitter coil. The transmitter coil and implanted receiving coil are positioned proximate to each other by two magnets.

The speech processor converts the analog signal of the microphone into encoded digital signals. The transmitter modulates a RF (radio frequency, e.g. 5 MHz) carrier with the encoded digital signal. The transmitter also comprises coil drivers for driving the transmitter coil based on the modulated RF carrier. The transmitter coil inductively couples to the implanted receiving coil so that both data and energy are transmitted into the implanted device. Thereby, the transmission path is designed to transmit energy and data as efficiently as possible, i.e. the transmission losses are as low as possible and the data integrity is as high as possible. The modulated RF carrier comprises a sequence of pulses, which may be pulse width modulated, frequency modulated or amplitude modulated. In the case of amplitude modulated carriers, the carrier may be, e.g., modulated by switching on and off selected pulses. Thereby, a predetermined number of on/off-switched pulses define a data symbol containing a predetermined amount of information. In any case of modulation type, the series of pulses define a stream of energy and information which is used by the receiver.

Due to band-pass limitations and the resonant nature of the transmission path, an effect occurs, generally known as intersymbol interference (ISI). Thus, in a sentence, the basic problem of such devices is intersymbol interference caused by the band-pass filtering effect of inductively coupled resonant circuits.

SUMMARY

Embodiments of the present invention are generally directed to a at least partly ameliorating the above problems through a method for wirelessly transmitting a data stream, wherein a data pattern over a window in the data stream is analyzed. The window contains past, present and future data symbols. After analyzing the data content of the window it is determined how the energy content of data symbols or at least data symbol fragments have to be set in order to improve the integrity of the transmitted data.

In another aspect of this disclosure there is provided an apparatus for wirelessly transmitting data and energy between components of an implantable hearing prosthesis which allows analyzing data in a data stream comprising data to be sent next, preceding data and succeeding data. Moreover, the apparatus is able to set the energy content of the data to be sent next based on a result of an analysis of data from the past, from present and from the future.

The disclosed method and apparatus allow an improvement of the data integrity and at the same time a highly efficient energy transmission.

BRIEF DESCRIPTION OF THE DRAWINGS

Embodiments of the present invention are described in the following detailed description when taken with reference to the accompanying drawings in which.

DETAILED DESCRIPTION

It is to be noted that although the present disclosure is described with reference to the examples as illustrated in the following detailed description, the detailed description is not intended to limit the present invention to the particular examples disclosed therein, but rather should describe examples that merely exemplify the various aspects of the present invention, the scope of which is defined by the appended claims.

Figure 1:
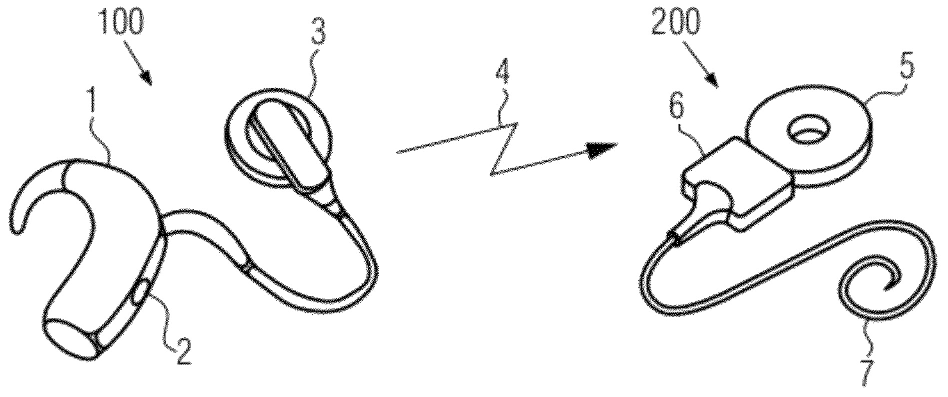
FIG. 1 shows components of a cochlear implant system.

FIG. 1 illustrates a conventional cochlear implant system that comprises an external component assembly 100 which may be directly attached to the body of a recipient, and an internal component assembly 200 which is permanently implanted in the recipient. The external assembly 100 typically comprises a housing 1 which has incorporated a microphone 2 for detecting sound, a speech processing unit (not shown), a transmission unit (not shown) including a radio frequency modulator and a coil driver, and a power source (not shown). A transmission coil 3 is connected with a transmitter unit and the housing 1 by a wire. The housing 1 is shaped so that it can be worn and held behind the ear. The speech processing unit of the housing 1 processes the output of the microphone 2 and generates coded signals which are provided to the transmitting coil 3 via the modulator and the coil driver.

The internal component 200 comprises a receiver unit (not shown) and a stimulator unit (not shown) which are placed in a housing 6. Attached to the housing 6 are a receiving coil 5 and an electrode assembly 7 which can be inserted in the cochlea. Magnets (not shown) may be secured to the internal receiving coil and the external transmitting coil 3 so that the external transmitting coil 3 can be positioned and secured via the magnets outside a recipient's head and opposed to the implanted receiving coil 5. The internal coil 5 receives power and data from the external coil 3. A cable of the electrode assembly 7 extends from the implanted housing 6 to the cochlea and terminates in an array of electrodes. Transmitted signals received from the receiving coil are processed by the receiver unit in the housing 6 and are provided to the stimulator unit in the housing 6. The stimulator unit generates signals which are applied by the array of electrodes to the cochlea thereby stimulating the auditory nerve.

The present disclosure is focused on the wireless transmission path and the preparation of the signals used for transmitting power and information. The structure of the data (content and encoding scheme) from the speech processing unit is of no further relevance for this disclosure so that an explanation thereof is omitted. For understanding this disclosure it is sufficient to assume that the information from the speech processing unit is provided as a sequence of data symbols which shall be wirelessly transmitted to the implanted part of the hearing aid. It has to be noted that although FIG. 1 shows an example for a cochlear implant, embodiments of the present invention may be used with other types of implantable hearing prosthesis, such as middle ear prosthesis or direct acoustic stimulation devices (DACS).

As noted above, the modulated RF carrier comprises a sequence of pulses, which may be pulse width modulated using a number of different methods. The sequence of modulated pulses define a stream of energy and information that is transmitted through external coil 3 and received by implanted receiving coil 5. One or more of the pulses in the sequence form a data symbol containing a predetermined amount of information. For ease of description, the term data symbol is used in the context of this disclosure as a fundamental information unit that represents a single bit of information. However, in practice, data symbol is not limited to a single bit, but may also include additional information. In physical reality, a data symbol may be represented by a physical parameter during a predetermined period of time. For example, a data symbol may be represented by a current which flows through a coil during a predetermined period of time, or it may be represented by a magnetic field strength during a predetermined period of time between transmitting and receiving coils, or it may be represented by a condition of one or a plurality of storage cells, capacitors, etc. Therefore, the term "data symbol" is used in a very general sense. By means of the following examples, the terms "bit" or "signal level" during a predetermined period of time relate to the general term "data symbol". It has to be noted that the physical parameter need not to be constant during the predetermined period of time or within an array of storage cells but may have a temporal or spatial pattern.

In order to simplify the explanations of the following examples, the following assumptions are made. The assumptions are based on state of the art wireless transmission schemes for implanted hearing aids like cochlear implants.

Assumption 1: a transmitter circuit modulates an RF carrier with data from the speech processing unit. The RF carrier is a continuous serious of equidistant sharp pulses which may be provided by an RF clock. If we assume 5 MHz as a carrier frequency, each pulse has a duration of 100 ns and is followed by a 100 ns pause. A pulse together with a pause is called a 1-cycle. The time period of a 1-cycle in a 5 MHz carrier is 200 ns. In conclusion, it is assumed for the following description that the RF carrier is an infinite sequence of 1-cycles.

Assumption 2: the transmitter circuit modulates the RF carrier using an on-off-keying (OOK).

Assumption 3: for simplification, it is assumed that a data symbol is represented by 5 cycles of the RF carrier. In order to form a high bit or a logical "1" the transmitter circuit generates 5 subsequent 1-cycles based on the RF carrier. In order to form a low bit or a logical "0" the transmitter circuit generates five subsequent 0-cycles. A 0-cycle is formed by simply providing a signal level of 0 for example by switching off the carrier during the time period of 5 cycles (On-Off-Keying).

In summary, we assume in the following that the transmitter circuit modulates an RF carrier using an on-off-keying, whereby one data symbol is represented by five cycles of the RF carrier. Since the signal amplitude is changed when switching between a 1-cycle and a 0-cycle, the on-off-keying is related to amplitude modulation.

It has to be emphasized, however, that the present invention is not limited to the above assumptions. For example the disclosed method can also be applied to frequency modulation and pulse width modulation of the carrier. Also an analog amplitude modulation in contrast to the digital on-off-keying amplitude modulation is possible. Moreover, a more sophisticated encoding of the data symbols is possible. For instance each symbol may be encoded by a particular binary code. As an example only, each symbol may be represented by eight cycles and a 0-bit may be represented by a BCD code element and a 1-bit may be represented by another BCD code element. Another possibility would be to subdivide a data symbol into a plurality of cells and each cell is modulated by on-off-keying whereas a data symbol is encoded by a plurality of on-off-keyed or otherwise encoded cells.

For the following considerations it is only necessary to know that a data element is formed by a plurality of cycles. Thereby, a data element may be a data symbol or a subunit of a data symbol, sometimes referred to herein as a cell. As such, a data symbol may comprise a plurality of data elements.

Figure 2:
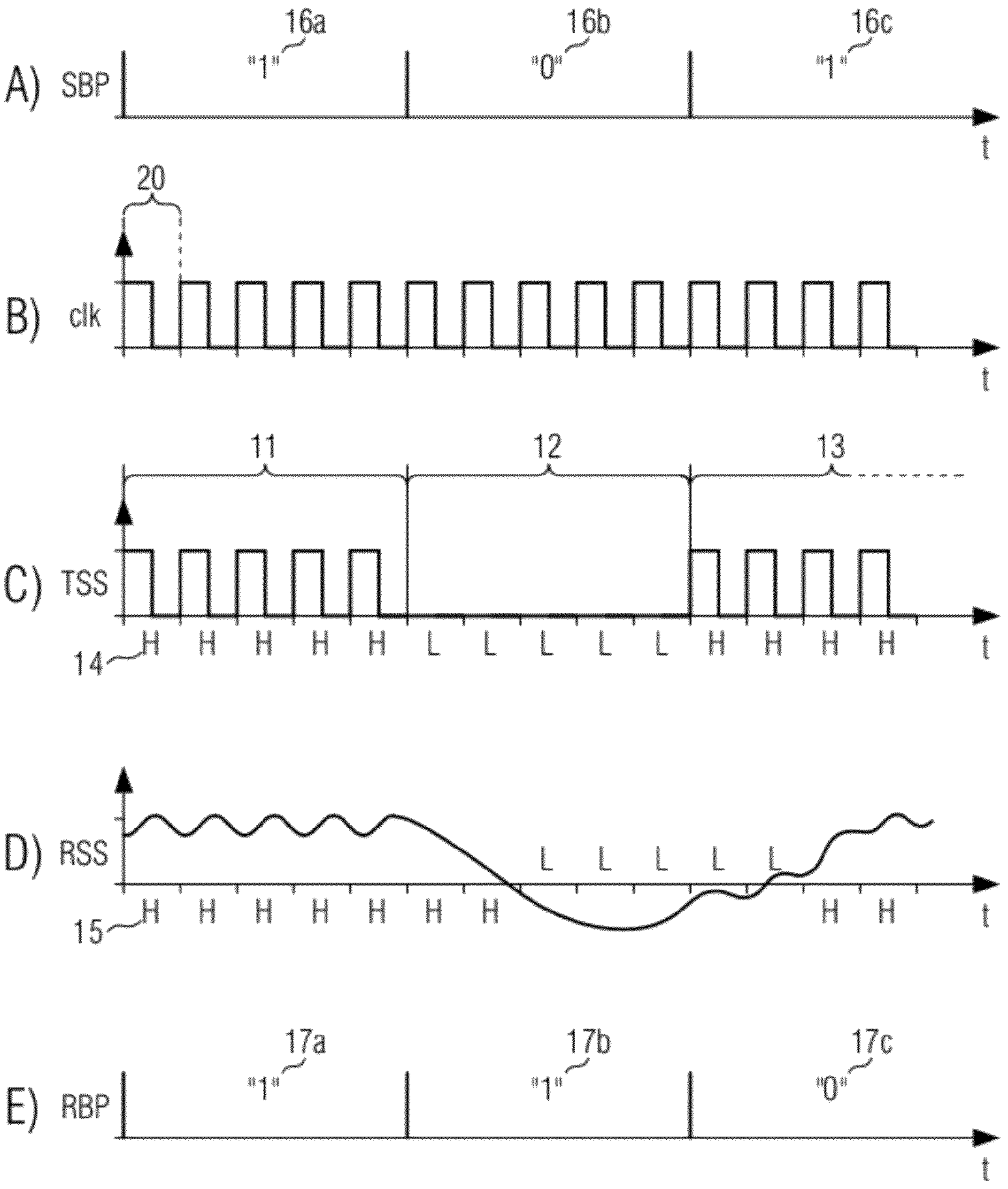
FIG. 2*a* shows a bit pattern which is intended to be sent over the wireless transmission path in accordance with the prior art.
FIG. 2*b* represents an RF carrier which can be derived from a clock signal.
FIG. 2*c* shows the pattern of a Transmitted Signal Stream (TSS) wherein the RF carrier of FIG. 2*b* has been amplitude modulated with a bit pattern of FIG. 2*a;*
FIG. 2*d* illustrates how the signal pattern of FIG. 2*c* changes after the transmission through the transmitting coil and the receiving coil.

FIG. 2 illustrates a signal pattern of wirelessly transmitted data according to a transmission scheme of the prior art. Specifically, FIG. 2*a* shows a bit pattern which is intended to be sent over the wireless transmission path. The "to be Sent Bit Pattern" SBP comprises in this illustrative example three data symbols representing three bits of information. The first data symbol 16*a* represents a logical "1" (high bit), the second data symbol 16*b* represents a logical "0" (low bit) and the third data symbol 16*c* represents a logical "1" (high bit).

FIG. 2*b* represents the RF carrier which can be derived from a clock signal Clk. The carrier comprises a continuous sequence of pulses, whereby the time period between the beginnings of 2 successive pulses defines a cycle 10. Since the time scales of the horizontal axis in FIGS. 2*a* and 2*b* is the same, it can be derived from FIG. 2 that each data symbol has a duration of 5 cycles.

Although FIG. 2*a* illustrates three successive data symbols, the elements 16*a*, 16*b* and 16*c* may also be subunits of 1 or more data symbols. Therefore, as noted above, in some cases the more general term "data element" is used in the present specification to indicate that the transmission scheme of FIG. 2 may be applied to data symbols and subunits of data symbols.

FIG. 2*c* shows the pattern of the Transmitted Signal Stream (TSS) wherein the RF carrier of FIG. 2*b* has been amplitude modulated with a bit pattern of FIG. 2*a*. Since on-off-keying has been used for modulation the carrier, the first data symbol 11 is represented by a sequence of five pulses (five 1-cycles). Similarly, the third data symbol 13 is represented by a sequence of five pulses (five 1-cycles). The second data symbol 12 which is a low bit is represented by a pause with a duration of five cycles (five 0-cycles). Reference numeral 14 in FIG. 2*c* illustrates a logical value corresponding to the signal value of each cycle.

FIG. 2*d* illustrates how the signal pattern of FIG. 2*c* changes after the transmission through the transmitting coil and the receiving coil. As it can be seen from FIG. 2*d*, the Received Signal Stream (RSS) differs dramatically from the signal pattern in FIG. 2*c*. The receiving unit tries to recover the signal values of the sent signal pattern according to FIG. 2*d*. Due to transmission distortions, the original signal pattern can not, however, correctly be restored as it is indicated with numeral 15, which illustrates, to what logical equivalents the signal values will be restored from the received signal stream RSS.

It has to be noted that FIG. 2 and in particular FIG. 2*d* have only illustrative character and should explain transmission effects in an illustrative manner. Although FIG. 2*d* may reflect a real situation of a received signal pattern, this signal pattern sometimes doesn't exactly represent what the received signal will look like. There are cases where the fine structure still may have 5 MHz signal transitions. In this case, FIG. 2*d* would show an "envelope" of the received signal rather than the received signal itself. In fact, hearing aid transmission systems of the state of the art often extract the envelope of the signal and base its decision (whether a "1" or "0" was transmitted) on only the signal envelope. The same annotation may be applied to FIG. 3*d* which is explained later.

FIG. 2*e* illustrates the Received Bit Pattern (RBP) which is recovered from the received signal stream according to FIG. 2*d*. As it can be seen from FIG. 2*e*, the first received data symbol 17*a* is the same as the first sent data symbol 16*a*. The second received data symbol 17*b* has been however changed from a low bit to a high bit. Similarly, the third received data symbol 17*c* has been changed from a high bit to a low bit.

There are generally two reasons for the above transmission errors. The first reason is that the system is band-limited and will not allow sharp transitions in the signal. If the signal to be transmitted switches rapidly from a "1" to a "0" (or vice versa), the band-limited system reacts by smoothing this transition so that it occurs much more gradually than intended.

The second reason is that the primary circuit (transmitting side) and the secondary circuit (receiving side) are designed to resonate at the frequency of transmission to achieve higher power efficiency. An effect of this circuit design is that the signal will "ring" causing distortions on adjacent symbols. This effect is explained in more detail below in connection with FIG. 4.

Both reasons lead to an effect that is called "intersymbol interference", because the filtering effect of a communication channel causes the current symbol to interfere with adjacent symbols.

The distortion of the transmitted signal and the interference between symbols caused by the filtering effect of the circuitry can result in detection errors which are illustrated in FIG. 2. The severity of this type of distortion depends on the sequence of symbols that is transmitted. For instance, a sequence of "0" symbols followed by a "1" symbol (or vice versa) results in particularly severe distortion of the transmitted sequence. The reason therefore is that due to bandwidth limitation and the resonant character of the transmission path the energy state of the circuit can not instantaneously change. It requires some time for resistances and applied voltages in the system to attain the desired steady state amplitude corresponding to a "1" or "0". For example, if we make a transition from a "1" symbol to a "0" symbol, it might take so long to dissipate the energy stored in the circuit that a significant portion of the energy from the "1" symbol is still there when the next "0" signal is detected at the receiver.

A parameter which characterizes bandwidth and resonant nature is the "quality" factor or "Q". A "high-Q" resonant circuit has a very narrow bandwidth. A "low-Q" resonant circuit has a wide bandwidth. In a coupled system as in the present case (sending and receiving circuits) the bandwidth of the system also changes with the transmission range. In the present case, the bandwidth of the coupled system is reduced at longer ranges.

There are several approaches possible to improve data integrity, each is connected with its own drawbacks.

A first approach is to send additional redundant information. Such a method would, however, decrease the data throughput.

In a second approach the bandwidth of the transmission system may be increased in order to reduce bandwidth limitation. In other words, "Q" of the primary and secondary resonance circuits may be decreased. The "Q" can be decreased by placing a resistor in the transmitting and/or receiving resonant circuits. Thus the bandwidth of the resonant circuit can be increased so that the signal distortion can be reduced. The resistor dissipates, however, energy as heat which cannot be recovered on the receiving side. Since the transmission path is also used as a path for transmitting energy, this approach would decrease the power efficiency.

In a third approach, a method called "equalization" may be used. Since the signal distortion is due to the filtering effect of the resonant circuit, the transmitted signal can be recovered by filtering again the signal on the receiving side. The filter on the receiving side has to have the inverse characteristic of the circuit response. This method is, however, very computationally intensive and requires often modifying and adding extra hardware to existing devices.

In a fourth approach, a method called "pulse-shaping" may be applied. The "ringing" effect due to the sudden signal transitions between rectangular pulse shapes can be avoided, when "smoother" signals having less abrupt transitions instead of rectangular pulse shapes are used. For instance triangular wave-forms or pulses having curved features (Gaussian pulses or raised-cosine shapes) are possible. Pulse-shaping requires, however, modifying and adding extra hardware to existing devices.

Although, it might be possible in some cases to introduce equalization or pulse shaping in firmware without introducing extra hardware, it remains very computationally intensive and occupies hardware resources.

Embodiments of the present invention are directed to a different approach. More particularly, the present disclosure provides a method wherein the data element to send next, referred to herein as the next data element, as well as at least the preceding and succeeding data elements, are analyzed in order to set a signal pattern that ensures that the data element to be sent next can be correctly recovered on the receiving side, thereby accounting for intersymbol interference. More particularly, a window of the data stream that contains the next data element, as well as at least the preceding data element (i.e. the data element that was sent immediately before the next data element) and at least the succeeding data element (i.e. the data element that is to be sent immediately after the next data element) is generated. Depending on the transmission characteristics of the transmission path, the content of the window within the data stream to be sent wirelessly is examined in order to determine an energy content with which a data element has to be sent so that the data can be recovered securely. In more practical terms, the window is realized with a buffer which contains the next data element (or a data symbol), and at least one preceding data element and at least one succeeding data element. The buffer size has to be determined based on characteristic transmission properties of the system. For example, a step shaped pulse can be used to determine characteristic response times.

As noted above, the analyzed window in accordance with embodiments of the present invention contain at least the preceding data element and at least the succeeding data element. Also as noted above, the size of the window (buffer) may vary depending on a number of factors. In certain embodiments, two or more preceding and succeeding data elements may be included in the window. In such embodiments, the two or more preceding data elements are the two or more data elements that immediately precede the next data element, while the two or more succeeding data elements are the two or more data elements that immediately follow the next data element.

Figure 4:
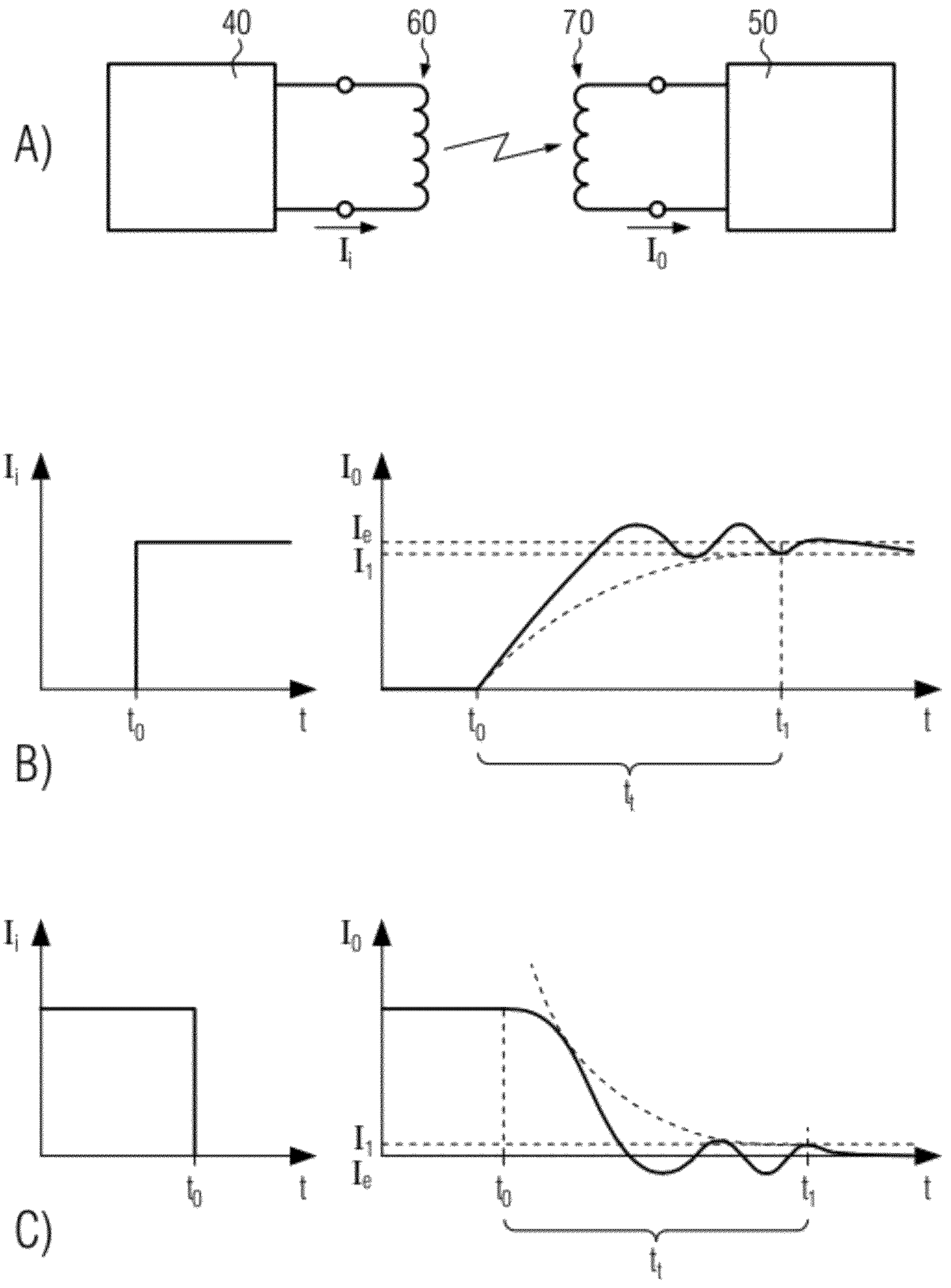
FIG. 4 shows characteristic transmission properties of inductively coupled devices as illustrated in FIG. 1.

FIG. 4 illustrates embodiments of the present invention in more detail. FIG. 4*a* illustrates the transmission path with the transmission circuit 40, the transmitting coil 60, the receiving coil 70 and the receiver circuit 50. The transmission circuit 40 generates a current Ii for driving the sending coil 60. Due to inductive coupling, an output current Io is induced in the receiving coil 70 which is received by the receiver circuit 50.

FIG. 4*b* illustrates the response signal Io in the receiving coil 70 in response to a step up shaped signal Ii in the transmitting coil 60. As it can be seen from FIG. 4*b*, the signal $I_o$ in the receiving coil 70 does not follow a step up shape but has a transient part and a steady state part. A characteristic time $t_t$ of the transient part of the response signal Io may be defined as the time between a beginning of the signal and the time $t_1$ when the signal Io reaches 90 percent value $I_1$ of, for example, its steady state value $I_e$. Due to the resonant character of the transmission path, it can be seen in FIG. 4*b* that the response signal $I_o$ oscillates around its steady state value $I_e$. This effect is known as "ringing".

FIG. 4*c* shows the similar effect as in FIG. 4*b* for a step down shaped pulse response. Similar as in FIG. 4*b*, a characteristic time $t_t$ can be determined for the transient part of the response signal $I_o$.

As noted above, the buffer size may be determined based on characteristic transmission properties of the system. In certain embodiments of the present invention, the buffer includes a predetermined number N of successive data elements. The number N may be selected, in one example, based on a characteristic decay time, $t_t$ of the transient part of a transmission response to the step shaped signal.

Based on the characteristic time $t_t$ of the transient part a buffer size (window) can be determined. For example, if a characteristic transient time $t_t$ is equal to 7 cycles of the clock (carrier) as in the example of FIG. 2, the window should contain the data element to be sent next (5 cycles) and a succeeding data element as well as a preceding data element. In case that the characteristic transient time $t_t$ would be 12 cycles, the buffer size would have to be adjusted so that two succeeding data elements and two preceding data elements can be analyzed.

The determination of the buffer size (window size) may be done once during an installation of the hearing aid, or it may be carried out each time when the hearing device is switched on, or it may be determined frequently in order to guarantee data integrity even if the position of the magnetically fixed transmission coil has changed.

In order to set a particular transmission energy for the symbol to be sent next, a look up table can be used which can map every possible data pattern within the buffer to a particular signal pattern having a predetermined energy content for the data element to be sent next. For example if the buffer length is three, i.e. three data elements are investigated in the buffer as exemplified in FIG. 2, a look-up table may contain $2^3=8$ entries for possible data patterns. When the buffer length is five, the look-up table would have $2^5=32$ entries.

In order solve the stated problems, the Transmitted Signal Stream TSS of FIG. 2*c* is modified by means of the look up table so that a bit pattern to be sent SBP according to FIG. 2*a* can be transmitted and correctly recovered again in the receiver. For this purpose, the bit pattern SBP according to FIG. 2*a* is input into the look-up table and the look-up table maps the bit pattern to a new signal pattern. The result of this mapping is shown in FIG. 3.

FIG. 3*a* and FIG. 3*b* are analogous to FIGS. 2*a* and 2*b*. As in FIG. 2*a*, FIG. 3*a* shows a bit pattern which is intended to be sent over the wireless transmission path. The "to be Sent Bit Pattern" (SBP) comprises in this illustrative example three data symbols representing three bits. The first data symbol 26*a* represents a logical "1" (high bit), the second data symbol 26*b* represents a logical "0" (low bit) and the third data symbol 26*c* represents a logical "1" (high bit). FIG. 3*b* represents the RF carrier which can be derived from a clock signal Clk. The carrier comprises a continuous sequence of pulses, whereby the time period between the beginnings of 2 successive pulses defines a cycle 20.

FIG. 3*c* shows the modified signal pattern in comparison to FIG. 2*c*. As it can be seen, the last two cycles of the first data symbol 11 (data element) have been replaced with 0-cycles and the last two cycles of the second data symbol 12 (data element) have been replaced with 1-cycles. The corresponding logical value of each cycle is illustrated with reference numeral 24. Since each pulse has a particular energy content which is roughly proportional to the area of a pulse, it is clear that by this method the energy content of a data symbol is modified.

Figure 3:
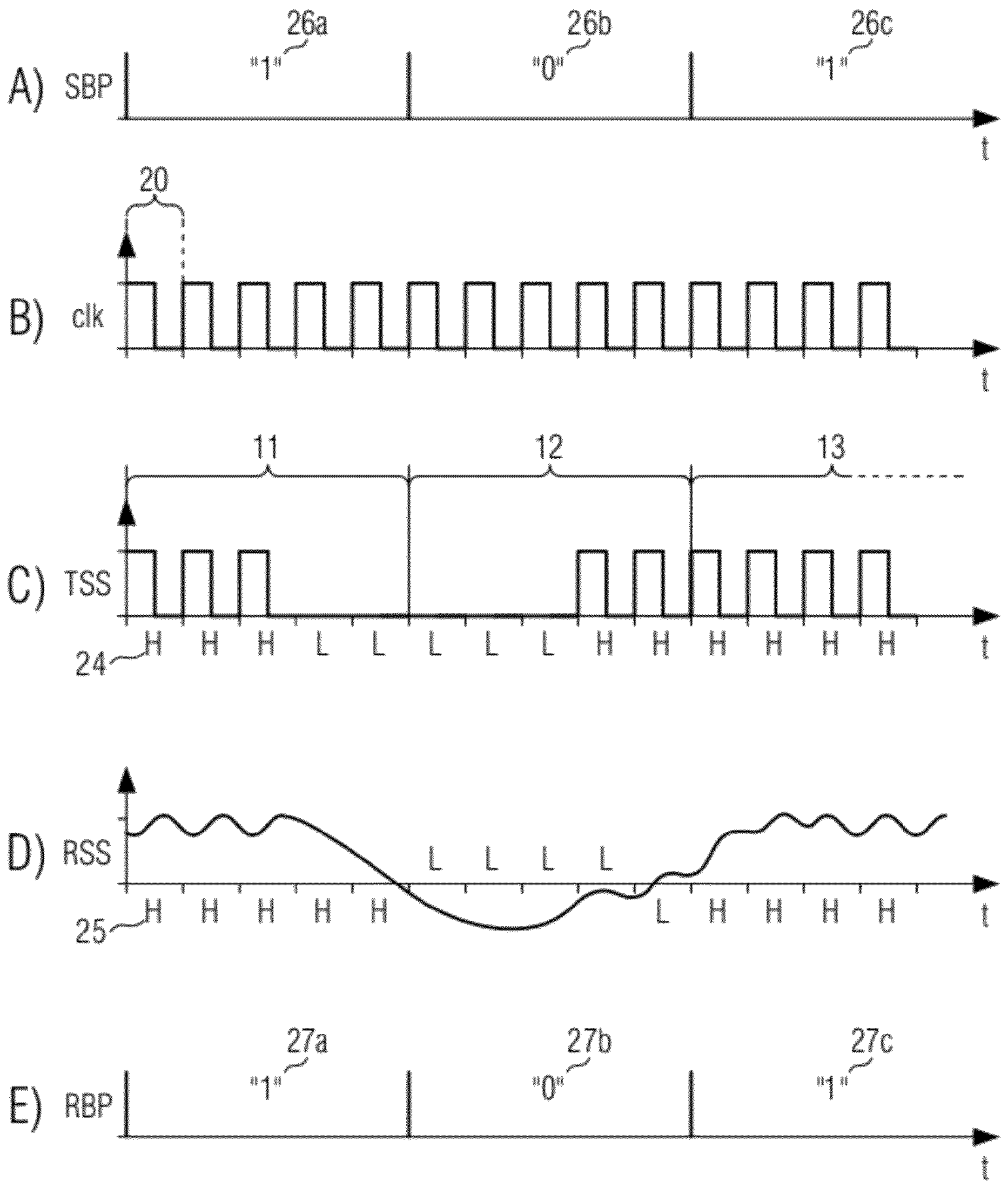
FIG. 3 shows a signal transmission scheme according to the present disclosure.

Although FIG. 3 exemplifies the method of this disclosure by merely adding or removing 1-cycles, the method is not limited thereto. Changing the energy content of the data symbols is the more generic concept of this disclosure so that the problems posed may also be solved by changing the energy content by changing the amplitude of the signal (e.g. the current through the coil) or by changing the pulse width. Since the amplitude need not be constant, the general expression for the energy content of a data element is the square of the signal (current) integrated over the time (time period for the data element). That is, the transmission energy of the data element corresponds to the square of a current through a transmission coil integrated over the sending period. In certain embodiments, the transmission energy is set by one of reducing and enlarging an area defined by the integration of the square of the current through a transmission coil integrated over the sending period.

As it can be seen from FIG. 3*d*, the modified signal pattern TSS according to FIG. 3*c* leads to a shift of the received signal pattern RSS and the corresponding logical values 25 of the received cycles so that the original bit pattern SBP can be restored in the receiver unit 6 as illustrated in FIG. 3*e*. The restored bit pattern RBP (27*a*, 27*b*, 27*c*) corresponds to the sent bit pattern SBP (26*a*, 26*b*, 26*c*). As mentioned in connection with FIG. 2*d* the signal pattern of FIG. 3*d* may represent a signal envelope.

Thus the signal integrity can be improved automatically and case-sensitive. Moreover, despite the fact that energy efficiency and data integrity are conflicting parameters, the signal integrity can be improved and the power efficiency can be maintained at the same time. Another advantage of this method is that it can be applied to existing and already implanted systems.

The present disclosure has been explained basically by means of the example illustrated in FIG. 3. It is, however, not intended to limit this invention to this particular example because many modifications are possible as outlined in the previous description or may become apparent to a person skilled in the art when he reads the present specification. For example, a single buffer size that is programmed into the device once during manufacturing may be implemented. This buffer size would represent a compromise that works reasonably well for all expected users. Also, the values in the look-up-table itself (not just the buffer size) could be programmed once at manufacturing, programmed once during installation of the hearing aid, or updated frequently (either by the user, firmware updates, etc). For best results, they would be customized for every different user's ear characteristics and perhaps updated periodically to reflect any aging in the system. Therefore, the appended claims shall define the scope of this disclosure which includes all possible modifications of the example of FIG. 3 which are partly described in the description and which will become apparent from the description for a person skilled in the art.

What is claimed is:

1. A method for wirelessly transmitting a data stream between first and second components of an implantable hearing prosthesis via a wireless transmission path, comprising:

buffering, at the first component, a portion of the data stream as a window, wherein the window includes a sequence of successive data elements comprising a data element to be transmitted next across the wireless transmission path, at least one preceding data element previously transmitted across the wireless transmission path, and at least one succeeding data element to be transmitted across the wireless transmission path subsequent to transmission of the data element to be transmitted next;

analyzing content of the window buffered at the first component to identify transmission characteristics of the wireless transmission path;

adjusting the energy content of the data element to be transmitted next based on a result of the preceding analysis of the content of the window to generate an adjusted data element to be transmitted next; and transmitting the adjusted data element to be transmitted next from the first component to the second component via the wireless transmission path.

2. The method of claim 1, wherein each data element comprises a plurality of cycles of a timing clock.

3. The method of claim 2, wherein the energy content of the data element is adjusted by altering the energy content of at least one cycle.

4. The method of claim 3, wherein the energy content of a cycle is altered by at least one of reducing and enlarging the time period within a cycle in which a signal level corresponds to a Hi-Bit.

5. The method of claim 3, wherein the energy content of a cycle is altered by changing a signal level within a cycle corresponding to a logical value to a signal level having a complementary logical value in a binary scheme.

6. The method of claim 2, wherein the energy content of the data element is adjusted by adding or subtracting at least one 1-cycle, wherein a 1-cycle is a cycle having a signal level corresponding to a Hi-Bit.

7. The method of claim 1, wherein adjusting the energy content of the data element to be transmitted next is carried out on the basis of a look-up table.

8. The method of claim 7, wherein analyzing the content of the window comprises comparing a binary pattern of the window with patterns in the look-up table.

9. The method of claim 1, further comprising determining the predetermined number of said successive data elements in said window to determine a window size on the basis of a characteristic decay time $t_r$ of a transient part of a transmission response to a step shaped signal.

10. The method of claim 9, wherein the window size is determined each time when a transmission device is turned on.

11. The method of claim 9, wherein the window size is determined once in connection with an installation procedure and stored within the transmission device.

12. An apparatus for wirelessly transmitting of data and energy to an implantable hearing prosthesis, the device comprising:

a sending coil;

a device for buffering a sequence of successive data elements forming part of a data stream transmitted from the apparatus to the implantable hearing prosthesis, wherein the successive data elements include a data element to be sent next to the implantable hearing prosthesis, at least one preceding data element previously transmitted to the implantable hearing prosthesis, and at least one succeeding data element to be transmitted to the implantable hearing prosthesis subsequent to transmission of the data element to be transmitted next;

a device for analyzing a content of the buffer;

a device for setting an energy content of the data element to be transmitted next based on a result output by the device for analyzing the content of the buffer.

13. The device of claim 12, wherein a buffer size of the buffer device is configurable depending on a characteristic decay time of a transmitted step shaped signal.

14. The device of claim 12, further comprising a storage device configured to store a look-up table for mapping a binary pattern of the buffer to a signal pattern for the data element to be sent next, and a buffer size of the configurable buffer device.

15. A method comprising:

buffering a sequence of successive data elements forming part of a data stream transmitted from an external component to an implantable component, wherein the successive data elements include a data element to be sent next to the implantable component, at least one preceding data element previously transmitted to the implantable component, and at least one succeeding data element to be transmitted to the implantable component subsequent to transmission of the data element to be transmitted next;

analyzing the buffered sequence of successive data elements to identify transmission characteristics of a wireless transcutaneous link between the external and implantable components; and adjusting the energy content of the data element to be transmitted next based on the analysis of the buffer.

16. The method of claim 15, wherein each data element comprises a plurality of cycles of a timing clock.

17. The method of claim 16, wherein adjusting the energy content of the data element to be transmitted next comprises:

altering the energy content of at least one cycle.

18. The method of claim 16, wherein adjusting the energy content of the data element to be transmitted next comprises:

adding or subtracting at least one 1-cycle, wherein a 1-cycle is a cycle having a signal level corresponding to a Hi-Bit.

19. The method of claim 15, wherein adjusting the energy content of the data element to be transmitted next comprises:

adjusting the energy content of the data element to be transmitted next based on a look-up table.

* * * * *